(12) United States Patent
Kataoka et al.

(10) Patent No.: US 7,534,956 B2
(45) Date of Patent: May 19, 2009

(54) SOLAR CELL MODULE HAVING AN ELECTRIC DEVICE

(75) Inventors: Ichiro Kataoka, Shiga (JP); Akiharu Takabayashi, Shiga (JP); Hidehisa Makita, Shiga (JP); Masaaki Matsushita, Shiga (JP); Takaaki Mukai, Shiga (JP); Shigenori Itoyama, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 932 days.

(21) Appl. No.: 10/819,198

(22) Filed: Apr. 7, 2004

(65) Prior Publication Data

US 2005/0000562 A1    Jan. 6, 2005

(30) Foreign Application Priority Data

Apr. 10, 2003    (JP)    ............... 2003/106352

(51) Int. Cl.
*H01L 25/00*    (2006.01)
*H01L 31/00*    (2006.01)
*H01L 31/042*    (2006.01)
*H02N 6/00*    (2006.01)

(52) U.S. Cl. ................. 136/251; 136/243; 136/244

(58) Field of Classification Search ........... None
See application file for complete search history.

(56) References Cited

U.S. PATENT DOCUMENTS

| | | | |
|---|---|---|---|
| 5,578,141 A | 11/1996 | Mori et al. | 136/251 |
| 5,589,006 A | 12/1996 | Itoyama et al. | 136/248 |
| 5,660,646 A | 8/1997 | Kataoka et al. | 136/251 |
| 5,684,325 A | 11/1997 | Kataoka et al. | 257/433 |
| 5,718,772 A | 2/1998 | Mori et al. | 136/251 |
| 5,800,631 A | 9/1998 | Yamada et al. | 136/251 |
| 5,849,107 A | 12/1998 | Itoyama et al. | 136/248 |
| 5,973,258 A | 10/1999 | Shiotsuka et al. | 136/252 |
| 5,998,729 A | 12/1999 | Shiomi et al. | 136/251 |
| 6,034,323 A | 3/2000 | Yamada et al. | 136/259 |
| 6,066,796 A * | 5/2000 | Itoyama et al. | 136/251 |
| 6,066,797 A * | 5/2000 | Toyomura et al. | 136/251 |
| 6,075,202 A | 6/2000 | Mori et al. | 136/251 |
| 6,093,884 A | 7/2000 | Toyomura et al. | 136/244 |
| 6,113,718 A | 9/2000 | Yamada et al. | 156/78 |
| 6,133,522 A | 10/2000 | Kataoka et al. | 136/259 |
| 6,162,986 A | 12/2000 | Shiotsuka et al. | 136/244 |
| 6,175,075 B1 | 1/2001 | Shiotsuka et al. | 136/251 |
| 6,182,403 B1 | 2/2001 | Mimura et al. | 52/173.3 |
| 6,218,609 B1 | 4/2001 | Mori et al. | 136/259 |

(Continued)

FOREIGN PATENT DOCUMENTS

JP    7-263768    10/1995

(Continued)

*Primary Examiner*—Kaj K Olsen
*Assistant Examiner*—Kourtney R Salzman
(74) *Attorney, Agent, or Firm*—Fitzpatrick, Cella, Harper & Scinto

(57) ABSTRACT

A solar cell module includes a front member placed at a light-incident side of the module; a sealing member having an exposed section that is not covered with the front member; solar cell elements that are sealed with the sealing member and covered with the front member; and an electric device, stored in a housing, for extracting electricity generated by the solar cell elements. The housing is fixed on the exposed section and is located at a light-incident side of the module.

14 Claims, 10 Drawing Sheets

U.S. PATENT DOCUMENTS

| | | | |
|---|---|---|---|
| 6,245,987 B1 | 6/2001 | Shiomi et al. | 136/244 |
| 6,265,242 B1 | 7/2001 | Komori et al. | 438/66 |
| 6,291,761 B1 | 9/2001 | Takada et al. | 136/244 |
| 6,294,724 B1 | 9/2001 | Sasaoka et al. | 136/251 |
| 6,307,144 B1 | 10/2001 | Mimura et al. | 136/244 |
| 6,307,145 B1 | 10/2001 | Kataoka et al. | 136/244 |
| 6,320,115 B1 | 11/2001 | Kataoka et al. | 136/251 |
| 6,323,478 B1 | 11/2001 | Fujisaki et al. | 250/214 SG |
| 6,331,671 B1 | 12/2001 | Makita et al. | 136/244 |
| 6,414,236 B1 | 7/2002 | Kataoka et al. | 136/251 |
| 6,437,235 B1 | 8/2002 | Komori et al. | 136/251 |
| 6,515,216 B2 | 2/2003 | Zenko et al. | 136/244 |
| 6,521,821 B2 | 2/2003 | Makita et al. | 136/244 |
| 6,534,702 B1 | 3/2003 | Makita et al. | 136/244 |
| 6,546,535 B1 | 4/2003 | Nagao et al. | 716/11 |
| 6,613,973 B2 | 9/2003 | Mukai et al. | 136/255 |
| 6,653,549 B2 | 11/2003 | Matsushita et al. | 136/244 |
| 6,664,597 B2 | 12/2003 | Takeyama et al. | 257/347 |
| 6,676,459 B2 | 1/2004 | Mukai et al. | 439/884 |
| 6,693,237 B2 | 2/2004 | Zenko et al. | 136/251 |
| 6,703,555 B2 | 3/2004 | Takabayashi et al. | 136/244 |
| 2001/0008143 A1 | 7/2001 | Sasaoka et al. | 136/244 |
| 2001/0054435 A1 | 12/2001 | Nagao et al. | 136/251 |
| 2002/0074034 A1 | 6/2002 | Fujisaki et al. | 136/246 |
| 2002/0195138 A1 | 12/2002 | Itoyama et al. | 136/251 |
| 2003/0000566 A1 | 1/2003 | Matsushita et al. | 136/244 |
| 2003/0005955 A1 | 1/2003 | Shiotsuka et al. | 136/251 |
| 2003/0010373 A1 | 1/2003 | Tsuzuki et al. | 136/244 |
| 2003/0010377 A1 * | 1/2003 | Fukuda et al. | 136/251 |
| 2003/0075211 A1 | 4/2003 | Makita et al. | 136/244 |
| 2003/0234038 A1 | 12/2003 | Kurokami et al. | 136/255 |
| 2004/0045595 A1 | 3/2004 | Makita et al. | 136/244 |
| 2004/0056768 A1 | 3/2004 | Matsushita et al. | 340/541 |

FOREIGN PATENT DOCUMENTS

| | | |
|---|---|---|
| JP | 10-335682 | 12/1998 |

* cited by examiner

SOLAR CELL MODULE HAVING AN ELECTRIC DEVICE

BACKGROUND OF THE INVENTION

1. Field of the Invention

The present invention relates to solar cell modules including solar cell elements sealed with a sealing member and particularly relates to a solar cell module including an electric device for extracting electricity generated by solar cell elements.

2. Description of the Related Art

In general, solar cell assemblies include a plurality of solar cell elements, connected to each other, for generating electricity with a desired voltage and current. Such assemblies cannot be used under harsh outdoor conditions without sealing the solar cell elements. Therefore, the solar cell elements must be sealed with sealing members, whereby the assemblies are transformed into solar cell modules. The sealing members usually contain ethylene-vinyl acetate (EVA) copolymer. Front members, such as glass sheets or fluorine resin films, having high weather resistance and transparency are placed at the tops of light-receiving faces of the solar cell modules. On the other hand, rear members, such as fluorine resin films or polyester films, having high weather resistance and insulation performance are placed on the faces opposite to the light-receiving faces. In the solar cell modules, the solar cell elements sealed with the sealing member are placed between the front members and rear members.

In order to extract electricity from the solar cell modules, electrodes connected to the solar cell elements are usually routed out of the sealing members, the front members, or the rear members. Techniques for routing the electrodes are disclosed in some documents. In the technique disclosed in Japanese Patent Laid-Open No. 2000-243996, an opening is formed such that the opening extends through a sealing member and a rear member to electrodes, placed on the side close to a rear face of a solar cell module, for extracting electricity, and lead wires placed in the opening are each soldered to the corresponding electrodes. In the technique disclosed in Japanese Patent Laid-Open No. 7-263768 or 10-335682, a notch is formed in end sections of a front or rear member and a sealing member such that electrodes are exposed.

Electrodes routed outside must be electrically insulated securely. That is, rainwater, which causes an electrical breakdown in connections of the electrodes, must be prevented from penetrating the connections if a solar cell module is used under harsh outdoor conditions. Therefore, usually, the electrode connections are fully covered with a terminal box or a junction box referred to as a housing. The electrodes are connected to cable connectors, extending out of the terminal box, with terminal blocks or the like placed in the terminal box, whereby the electricity can be withdrawn. In order to prevent the corrosion of the electrodes and connections placed in the terminal box, and in order to maintain the water tightness of the exposed portions of the electrodes, the terminal box is usually filled with a silicone sealant or the like. FIGS. 9 and 10 each illustrate a solar cell module with the terminal box. Reference numeral 23 represents a terminal box, reference numeral 24 represents a silicone sealant, and reference numeral 25 represents a connector cable.

In view of workability, it can be preferable to avoid placing protrusions, for example, the terminal box and the like, on rear faces of solar cell modules. In recent years, for example, a building-integrated photovoltaic module functioning as a building material has been extensively developed because such a module is effective in reducing cost for manufacturing photovoltaic systems and has a good appearance when placed on buildings. In the module, in view of workability, it can be preferable to avoid placing a terminal box on the rear face of the module. In this case, electrodes must be routed out of a front member and a terminal box must be placed on the front member, which cannot be securely joined to the terminal box. Since the front member must have high weather resistance, the front member usually includes a glass sheet or a fluorine resin film. In particular, when the front member includes such a fluorine resin film, the terminal box cannot be securely joined to the fluorine resin film. Therefore, the terminal box may be peeled off from the fluorine resin film.

In order to reduce cost for manufacturing solar cell modules, attempts have been made to reduce the thickness of the modules. Therefore, sections for extracting electricity must be simplified. Since new solar cell modules, which are readily installed and have good appearance in common with the building-integrated solar cell module, are being developed, the following components are in demand: electrode-routing components and electric device-fixing components which do not impair the flatness of the rear faces when electric devices, for example, terminal boxes, are placed on the modules and which are helpful in simplifying manufacturing steps, improving the yield, and greatly reducing manufacturing cost thereby.

SUMMARY OF THE INVENTION

The present invention has been made in view of the above circumstances, and it is an object of the present invention to provide a solar cell module which can be manufactured at low cost, from which electricity generated by solar cell elements can be efficiently extracted, and to which an electric device connected to the elements can be securely fixed.

In order to solve the above problems individually or in combination, the inventors have conducted extensive research and then found that configuration described below is advantageous.

A solar cell module of the present invention includes a front member placed at a light-incident side of the solar cell module; a sealing member having an exposed section that is not covered with the front member; solar cell elements that are sealed with the sealing member and covered with the front member; and an electric device, stored in a housing, for extracting electricity generated by the solar cell elements. The housing is fixed on the exposed section and is located at the light-incident side of the solar cell module. According to the above configuration, since the electric device is securely fixed to the exposed section, the electric device can be prevented from being detached from the exposed section and the electrical insulation of the lead electrodes and electric device can be prevented from being deteriorated if the solar cell module is exposed outdoors over a long period. Therefore, the solar cell module has high reliability.

In the solar cell module, the exposed section preferably extends out past an outer edge of the front member. In order to expose a portion of the sealing member from the front member, a slit opening may be formed in the front member before the solar cell elements are sealed. In such a method, the lead electrodes for extracting the electricity generated by the solar cell elements must be aligned with the slit opening when the solar cell elements, the sealing member, and the front member are stacked. Therefore, the method is complicated and is not fit for automation. However, in the present invention, the exposed section preferably extends out past an outer edge of the front member and the alignment is not therefore necessary; hence, a method for manufacturing the solar cell module is simple and the solar cell module can be manufactured at low cost. When the front member is made of glass, the formation of the opening in the front member causes an increase in manufacturing cost. However, in the present invention, the exposed section preferably extends out of the front member and the opening need not be therefore formed in the glass front member; hence, manufacturing cost is not high.

Electrical wiring members connected to the electric device may be fixed on the exposed section, whereby an external force exerted on the electrical wiring members is not directly transmitted to the electric device. Therefore, the electric device can be securely fixed to the exposed section and the reliability of the electric device is high.

A moisture-proof layer may be placed between the electric device and the sealing member, whereby moisture passing through the sealing member can be prevented from penetrating the electric device; hence, moisture can be prevented from lowering the adhesion of the housing, which stores the electric device, to the sealing member. Furthermore, moisture can be prevented from corroding wiring members placed in the electric device. If the moisture-proof layer includes a metal sheet, heat generated by the electric device can be released through the metal sheet.

According to the above configuration, an electrode-routing section and electric device-fixing section of the solar cell module have high reliability and can be formed at low cost. Furthermore, the solar cell module can be manufactured at low cost by a simple method. The electric device can be securely fixed to the exposed section, whereby the reliability of the electric device is ensured. Therefore, the electric device can be prevented from being detached from the exposed section and the insulation of the lead electrodes and the electric device can be prevented from being deteriorated if the solar cell module is exposed over a long period.

Further objects, features, and advantages of the present invention will become apparent from the following description of the preferred embodiments with reference to the attached drawings.

DESCRIPTION OF THE PREFERRED EMBODIMENTS

Figure 1A:
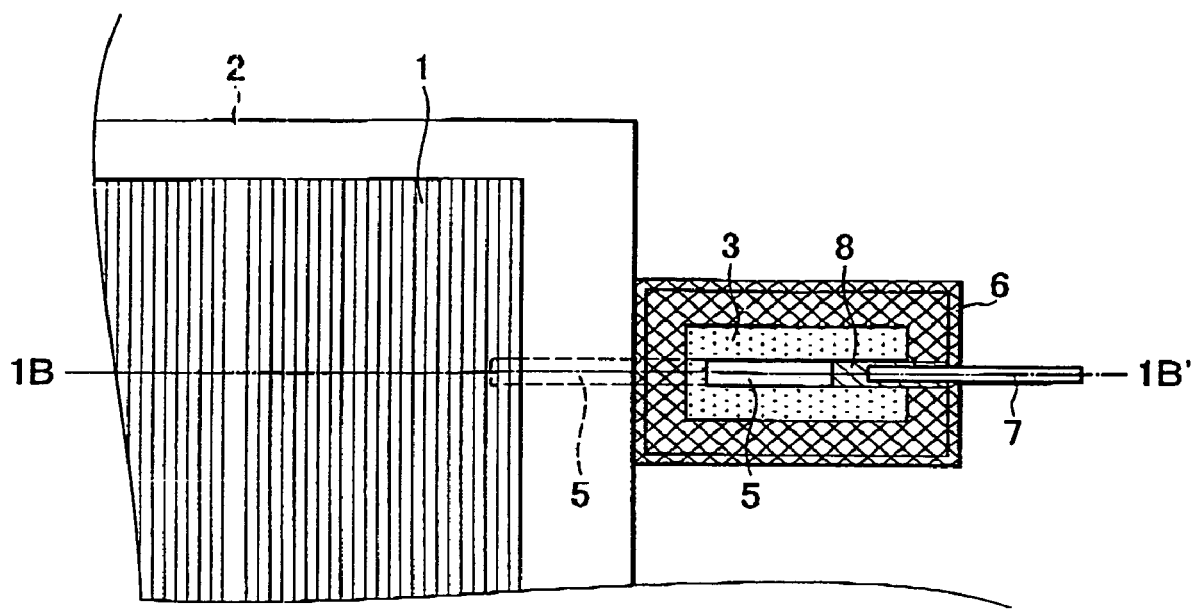
FIG. 1A is a schematic plan view showing a solar cell module according to a first embodiment of the present invention.
Figure 1B:
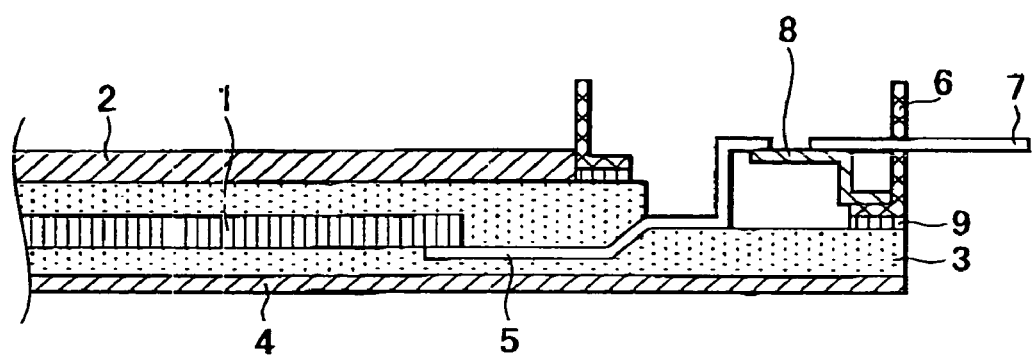
FIG. 1B is a schematic sectional view of the solar cell module taken along the line 1B-1B'.

FIG. 1A is a schematic plan view showing a solar cell module having a section on which electrodes and an electric device are placed according to an embodiment of the present invention. FIG. 1B is a schematic sectional view showing the solar cell module. With reference to FIGS. 1A and 1B, reference numeral 1 represents a solar cell element, reference numeral 2 represents a front member, reference numeral 3 represents a sealing member, reference numeral 4 represents a rear member, reference numeral 5 represents a lead electrode, reference numeral 6 represents a housing, reference numeral 7 represents an electrical wiring member, reference numeral 8 represents a terminal block, and reference numeral 9 represents an adhesive.

The solar cell module of the present invention includes the front member 2 placed at a light-incident side of the module; the solar cell elements 1 that are sealed with the sealing member 3 and covered with the front member 2; and an electric device for extracting electricity generated by the solar cell elements 1. The sealing member 3 has an exposed section that is not covered with the front member 2. The housing 6 storing the electric device is joined to the exposed section of the sealing member 3 and is located at a light-incident side of the module. In the solar cell module, the exposed section is preferably a region of the sealing member 3 extending out past an outer edge of the front member 2. For example, the following configuration is preferable: the sealing member 3 and the rear member 4 each have corresponding protrusions extending out past an outer edge of the front member 2, electricity generated by the solar cell elements is sent through metal strips connected to the solar cell elements 1 to apparatuses placed outside the sealing member 3, the metal strips are placed on the exposed section, and the electric device for receiving the electricity sent through the metal strips is connected to the metal strips and fixed on the exposed section.

As shown in FIGS. 1A and 1B, in order to extract the electricity generated by the solar cell elements 1, one lead electrode 5 is connected to an electrode placed on the rear face of a solar cell element 1. Another lead electrode 5 (not shown) is connected to a bus bar electrode (not shown) placed on the solar cell elements 1. The solar cell elements 1 may be connected to each other in series or in parallel according to needs such as voltage and current.

The lead electrodes 5 are routed out of the sealing member 3 having the exposed section extending out of the front member 2. In order to allow the sealing member 3 to be partly exposed, the sealing member 3 may have a protrusion extending out past an outer edge of the front member 2 as shown in FIGS. 1A and 1B or the front member 2 may have a notch or opening. The sealing member 3 preferably has the protrusion because the protrusion can be readily formed. In particular, when the front member 2 is made of an unmachinable material such as glass, the sealing member 3 having the protrusion can be prepared at a lower cost than that for forming such a notch or opening in the front member 2.

Since the exposed section of the sealing member 3 extends out past an outer edge of the front member 2, the rear member 4 preferably has a section extending under the exposed section. If the rear member 4 does not have such an extending section, the exposed section is bent or broken at the base in some cases when the electric device described below is placed an the exposed section, because the sealing member 3 has an insufficient stiffness. If the extending section supports the exposed section, the above problem can be avoided.

The housing 6 storing the electric device is fixed on the exposed section. Examples of the electric device include a terminal box, a converter such as a transformer or an inverter, and an electronic component such as a molded diode.

The adhesive 9 is used to fix the housing 6 to the exposed section. The adhesive 9 may contain one selected from known resins such as a silicone resin, an epoxy resin, an acrylic resin, a urethane resin, and a polyolefin resin. The adhesive 9 may be of a reactive curing type or a hot melt type or may be a double faced adhesive tape. Among those materials, the silicone resin and the double faced adhesive tape containing the acrylic resin are preferable because they have a good balance between the weather resistance and adhesion.

The lead electrodes 5 are connected to the terminal blocks 8 and/or lead wires placed in the housing 6, whereby the solar cell elements 1 are electrically connected to the electric device. The top of the housing 6 is covered with a lid member (not shown) according to needs, whereby the housing 6 is sealed up.

Figure 2:
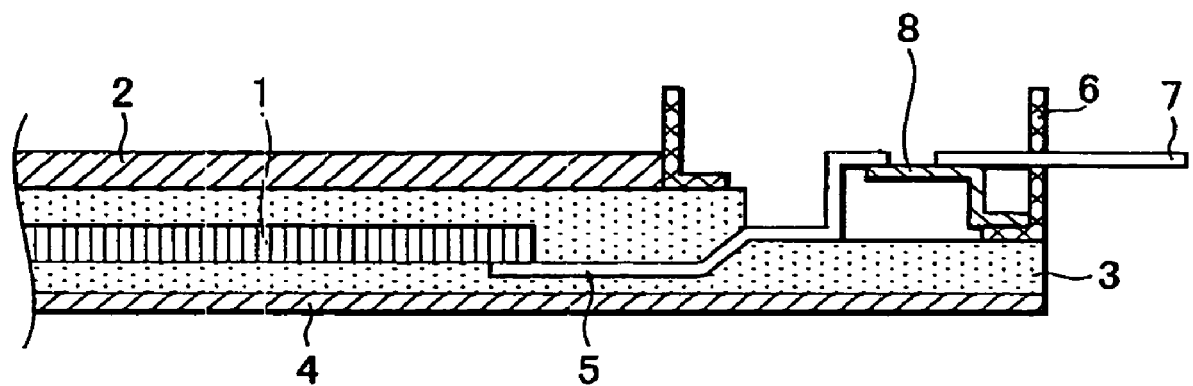
FIG. 2 is a schematic sectional view showing a solar cell module according to a second embodiment of the present invention.

In another embodiment, as shown in FIG. 2, the housing 6 is preferably fixed to the exposed section directly without using the adhesive 9. Since the sealing member 3 for sealing the solar cell elements 1 has an adhesive function and high weather resistance, the reliability of adhesion is satisfactory. When the electric device placed in the housing 6 has heat resistance, the housing 6 may be joined to the exposed section in a step of sealing the solar cell elements 1, whereby a process for manufacturing the module can be simplified.

Figure 3:
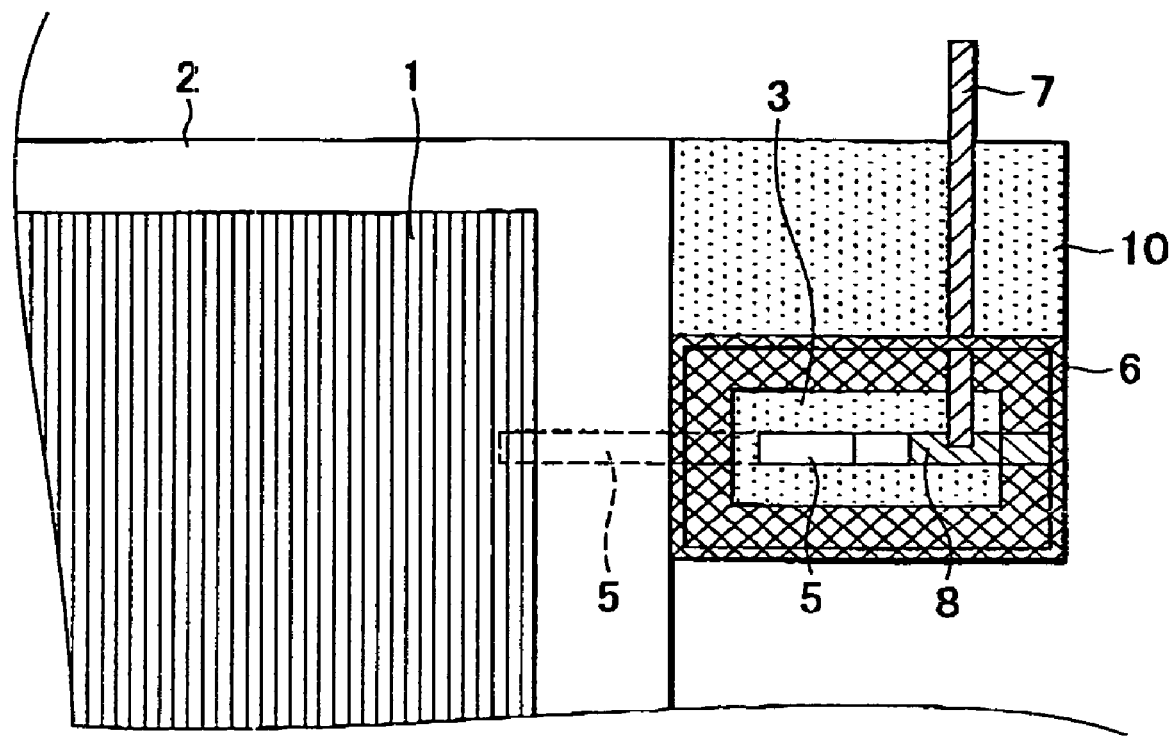
FIG. 3 is a schematic plan view showing a solar cell module according to a third embodiment of the present invention.

The electric device is usually connected to wires. In another embodiment, the sealing member 3 has a bare section 10 and each electrical wiring member 7 may be fixed to the bare section 10 as shown in FIG. 3. In such a configuration, when the electrical wiring member 7 is pulled, the pulling force is not directly transmitted to the electric device, whereby the electric device can be prevented from being detached from the bare section 10. The electrical wiring member 7 may be mechanically fixed to the bare section 10 with a fixture or fixed to the bare section 10 using an adhesive, a sealant, or the like.

Figure 4:
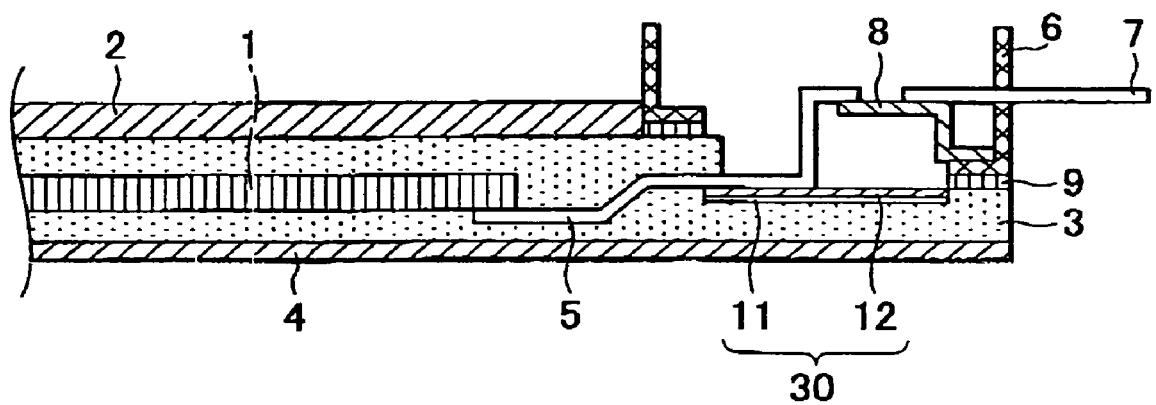
FIG. 4 is a schematic sectional view showing a solar cell module according to a fourth embodiment of the present invention.

In another embodiment, a moisture-proof layer 30 may be placed between the electric device and the sealing member 3 as shown in FIG. 4, whereby failures due to moisture can be prevented from occurring in the electric device. The moisture-proof layer 30 preferably includes a metal strip 11 because heat, which causes trouble in the electric device, can be effectively released from the electric device. The metal strip 11 may be selected among strips having high corrosion resistance and heat conductivity, and an aluminum strip is the most preferable. The metal strip may be laminated with a resin film 12. For example, an aluminum strip laminated with a polyester film is preferable.

Figure 5:
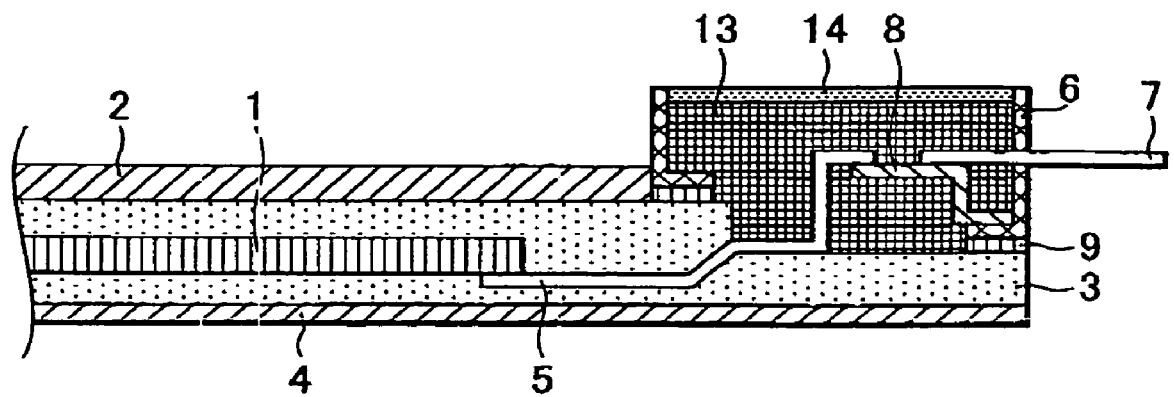
FIG. 5 is a schematic sectional view showing a solar cell module according to a fifth embodiment of the present invention.

In order to ensure the weather resistance, moisture resistance, and electrical insulation of electric components included in the electric device placed in the housing 6, the housing 6 may be filled with a resin filler 13 as shown in FIG. 5. Examples of the resin filler 13 include a silicone resin, an acrylic resin, an epoxy resin, a urethane resin, a polyolefin resin, and a polyester resin. In particular, the silicone resin is preferable in view of an environment in which the solar cell module is used, because the silicone resin has high weather resistance. In order to prevent moisture from penetrating the electric device and in order to enhance heat release properties, a metal plate or a metal sheet may be placed on the resin filler 13. In this case, the metal plate or sheet functions as a lid member 14.

The components of the solar cell module will now be described in detail.

The sealing member 3 covers irregularities due to the solar cell elements 1, protects the solar cell elements 1 from harsh conditions such as temperature variations, moisture, and impact, and ensures the adhesion of the solar cell elements 1 to the front member 2 or rear member 4. The sealing member 3 may contain ethylene-vinyl acetate (EVA) copolymer, ethylene-methyl acrylate (EMA) copolymer, ethylene-ethyl acrylate (EEA) copolymer, ethylene-methyl methacrylate (EMAA) copolymer, an ionomer resin, a polyvinyl butyral resin, or the like. Among those materials, the EVA copolymer is preferable, because the copolymer has a good balance among the properties of weather resistance, adhesion, filling properties, heat resistance, cold resistance, and shock resistance when used for solar cells. Since the EVA copolymer that has not yet been cross-linked has a low deformation temperature, deformation or creep occurs in the copolymer when used at a high temperature. Therefore, the EVA copolymer is preferably cross-linked, whereby the heat resistance is increased.

The solar cell elements 1 may be selected among the following known elements according to different needs: (1) crystalline silicon solar cells, (2) polycrystalline silicon solar cells, (3) microcrystalline silicon solar cells, (4) amorphous silicon solar cells, (5) copper-indium selenide solar cells, and (6) compound semiconductor solar cells. A desired number of the solar cell elements 1 are electrically connected to each other depending on the voltage or current. Alternatively, the solar cell elements 1 may be arranged on an insulating substrate in an integrated manner, whereby a desired voltage or current is obtained.

Since the front member 2 is located at the top of the solar cell module, the front member 2 must have superior properties, such as transparency, weather resistance, stain resistance, and mechanical strength, for ensuring the long-term reliability of the solar cell module exposed outdoors. Examples of the front member 2 include a sheet of tempered white glass, a fluorocarbon resin film, and an acrylic resin film. The tempered white glass is widely used for solar cell modules because the glass has high transparency and shock resistance and is therefore difficult to crack.

In recent years, there has been a demand for modules that are light-weight and flexible. Therefore, a resin film is suitable for the front member 2. In particular, the fluorocarbon resin film is preferable due to the high weather resistance and stain resistance. Examples of the fluorocarbon resin film include a polyvinylidene fluoride resins a polyvinyl fluoride resin, and ethylene-tetrafluoroethylene copolymer The polyvinylidene fluoride resin has better weather resistance than that of the other resins; however, the ethylene-tetrafluoroethylene copolymer has a better balance between weather resistance, mechanical strength and higher transparency as compared with the other resins.

The rear member 4 protects the solar cell elements 1, prevents moisture from penetrating the solar cell elements 1, and electrically Insulates the solar cell elements 1. A material for the rear member 4 is preferably superior in electrical insulation and long-term durability and able to endure thermal expansion and thermal shrinkage. Preferable examples of such a material include a polyvinyl fluoride film, a nylon film, a polyethylene terephthalate film, and a glass sheet.

In order to mechanically reinforce the rear member 4, a support sheet may be placed under the rear member 4.

Examples of the support sheet include a metal sheet, a fiber-reinforced plastic (FRP) sheet, and a ceramic sheet. In building-integrated photovoltaic modules, a building material functions as the support sheet.

The lead electrodes 5 are electrically connected to the solar cell elements 1 and used for extracting electricity from the solar cell module. A material for the lead electrodes 5 can be selected from known materials such as a copper sheet, a tin-lead plated copper sheet, and a tin plated copper sheet.

Examples of the present invention will now be described in detail.

EXAMPLE 1

A procedure for manufacturing a solar cell module according to an embodiment of the present invention is described below with reference to FIGS. 5, 7A, 7B, and 8. The solar cell module includes a plurality of solar cell elements 1 (amorphous silicon solar cells) each including corresponding conductive substrates, rear reflecting layers, semiconductor photoactive layers, transparent electrode layers disposed in that order and further includes interdigital collector electrodes placed on the transparent electrode layers and a bus bar electrode connected to the comblike collector electrodes.

The solar cell elements 1 are connected in series. One of the lead electrodes 5 each including a tin plated copper sheet is soldered to an electrode connected to an end of the series of solar cell elements 1.

Figure 8:
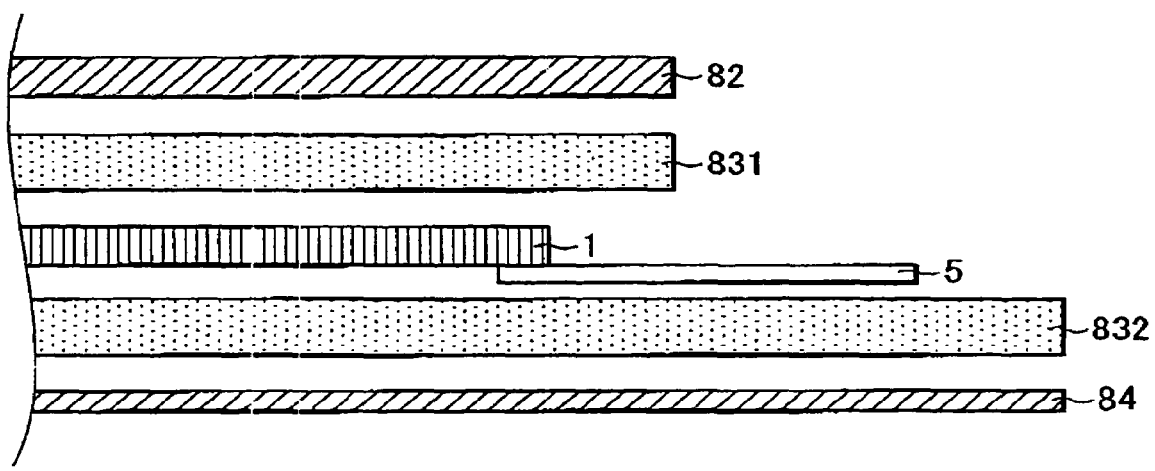
FIG. 8 is a sectional view showing the solar cell module of Example 1 which is not yet processed in the sealing step.
Figure 9:
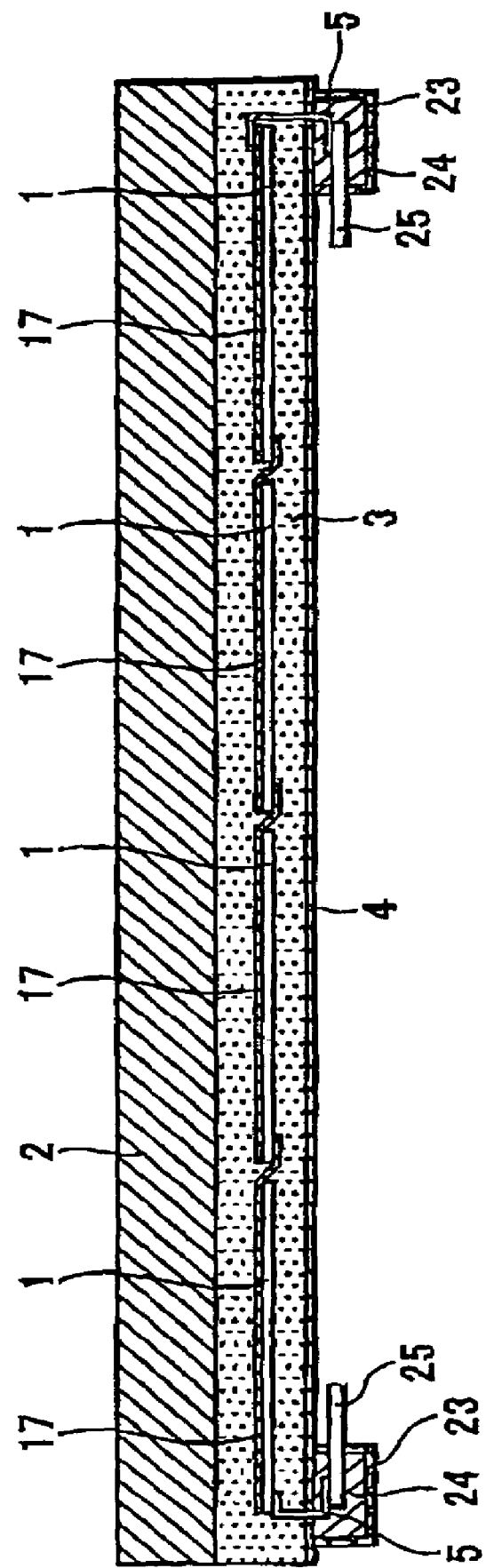
FIG. 9 is a schematic sectional view showing an example of a solar cell module including terminal boxes.
Figure 10:
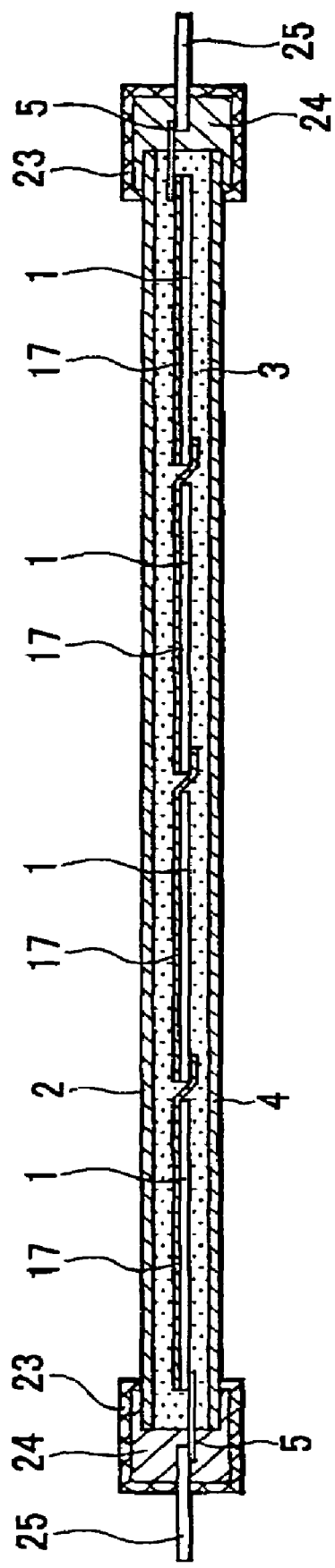
FIG. 10 is a schematic sectional view showing an example of another solar cell module including terminal boxes.

As shown in FIG. 8, the following components are stacked on a polyester film 84 having a thickness of 100 μm in this order: a first sheet 832 having a thickness of 0.4 mm, the resulting solar cell elements 1, a second sheet 831 having a thickness of 0.4 mm, and a transparent fluorocarbon resin film 82 having a thickness of 50 μm. The first and second sheets 832 and 831 contain an EVA resin for sealing the solar cell elements 1. The resulting components are heated and then pressed with a vacuum laminator, thereby sealing the solar cell elements 1. In the above configuration, the polyester film 84 and the first sheet 832 disposed thereon each have corresponding protrusions extending out past an outer edge of the fluorocarbon resin film 82. The resulting lead electrode 5 is placed on the protrusion of the first sheet 832, the protrusion not being covered by the fluorocarbon resin film 82. According to the above procedure, the solar cell module having an electrode-routing section shown in FIGS. 7A and 7B can be prepared.

As shown in FIG. 5, a housing 6 functioning as a terminal box is joined to the protrusion of the first sheet 832 with a moisture-curable silicone adhesive 9. An end of the lead electrode 5 is raised and then soldered to a terminal block 8 placed in the housing 6. An electrical wiring member 7 routed into the housing 6 is soldered to the resulting terminal block 8. A resin filler 13 containing an addition reaction-type two-part silicone potting compound is placed in the housing 6 such that the housing 6 is filled with the resin filler 13. A lid member 14 including an aluminum plate is placed on the top of the resulting housing 6, thereby sealing the housing 6.

Since there is no protrusion on the rear face of the solar cell module prepared according to the above procedure, the module can be readily joined to a stand or a building material by a simple method such as a joining method using an adhesive without depending on the shape of the stand or the building material. Since the electrode-routing section can be readily formed by placing the lead electrode 5 on the protrusion of the first sheet 832 in the stacking step, the module can be manufactured by an automation progress, whereby manufacturing cost can be reduced.

In order to evaluate the reliability of the electrode-routing section and the housing-fixing section, the solar cell module was investigated. The module was subjected to a temperature/humidity cycle test. In the test, the module was placed in a chamber having a temperature of 85° C. and a relative humidity of 85% for 22 hours and then maintained at −40° C. for 30 minutes, and that cycle was repeated 50 times. The housing-fixing section of the resulting module was immersed in a solution having an electric conductivity of 350 mS/cm, a voltage of 2,200 V was applied across the solution and the lead electrode 5, and then the leak current was determined, whereby the hermeticity of the housing 6 was evaluated.

The investigation result showed that the leakage current was not increased after the module was subjected to the test, that is, the module had sufficient electrical insulation.

EXAMPLE 2

A solar cell module of this example has a superstrate structure in which a glass sheet is placed at the top of a light-incident side of the module. This module can be prepared according to the procedure below using a tempered white glass sheet having a thickness of 3.3 mm instead of the fluorocarbon resin film 82 used in Example 1. In a sealing step, the following components are stacked: the tempered white glass sheet, a first EVA resin sheet having a thickness of 0.6 mm, solar cell elements connected in series, a second EVA resin sheet having a thickness of 0.4 mm, and a polyester film having a thickness of 100 μm. The resulting components are heated and then pressed with a vacuum laminator, whereby the solar cell elements are sealed. In the module, the second EVA resin sheet and the polyester film placed under the solar cell elements each have corresponding protrusions extending out of the tempered white glass sheet, and one of the lead electrodes is placed under the protrusion of the polyester film. This configuration is different from that of the solar cell module of Example 1. Other portions of the solar cell module of this example are substantially the same as those of the solar cell module of Example 1.

The solar cell module prepared according to the above procedure was investigated in the same manner as that of Example 1. The investigation result showed that the module had satisfactory hermeticity and sufficient electrical insulation.

EXAMPLE 3

A solar cell module of this example can be prepared according to the procedure described below. Solar cell elements, EVA resin sheets, a fluorocarbon resin sheet, and a polyester film are stacked. One of the EVA resin sheets has a protrusion, and a housing functioning as a terminal box is placed on the protrusion. The above components are heated and then pressed with a vacuum laminator, whereby the housing is directly joined to the protrusion. That is, the housing is joined to the protrusion in the step of sealing the solar cell elements That is different from the sealing step of Example 1.

The solar cell module prepared according to the above procedure was investigated in the same manner as that of Example 1. The investigation result showed that the module had no defects. Since an adhesive is not used in a step of joining the housing to the protrusion, a process for manufacturing the module can be simplified.

EXAMPLE 4

Figure 6A:
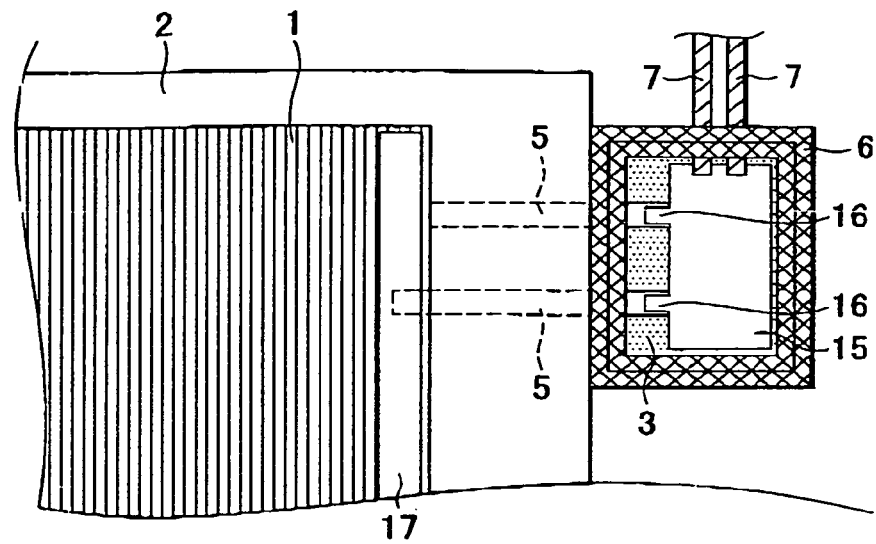
FIG. 6A is a schematic plan view showing a housing that is placed in the solar cell module of the fourth embodiment and is not yet filled with filler.
Figure 6B:
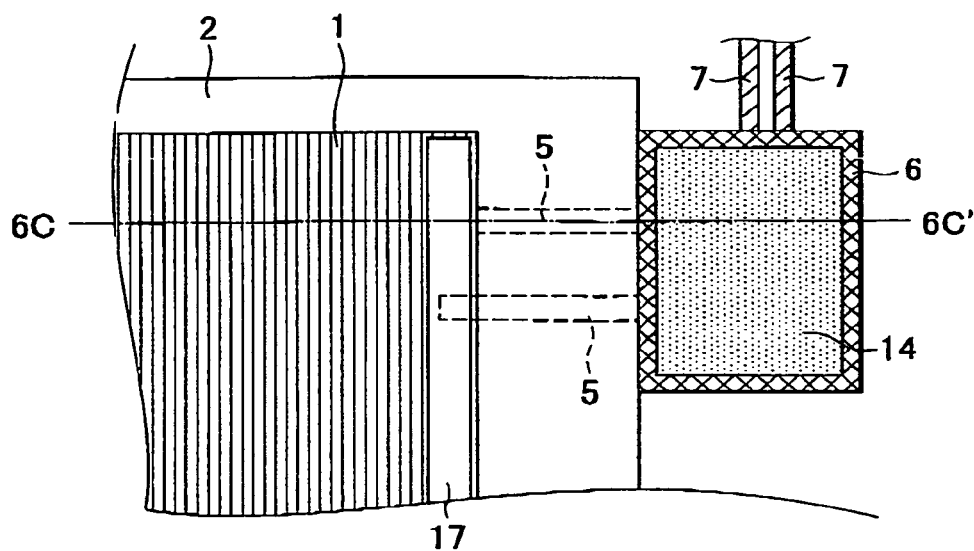
FIG. 6B is a schematic plan view showing the housing filled with the filler.
Figure 6C:
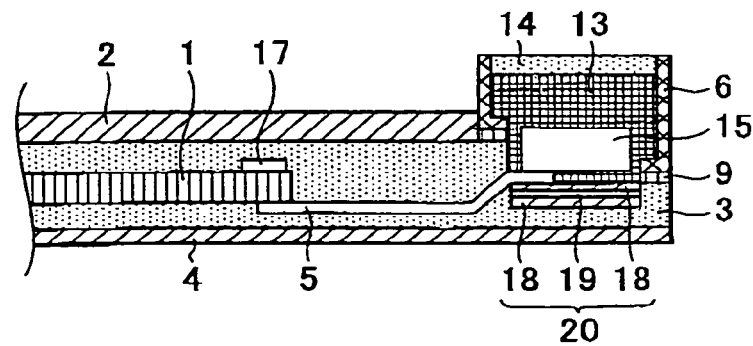
FIG. 6C is a schematic sectional view of the housing filled with the filler taken along the line 6C-6C'.
Figure 7A:
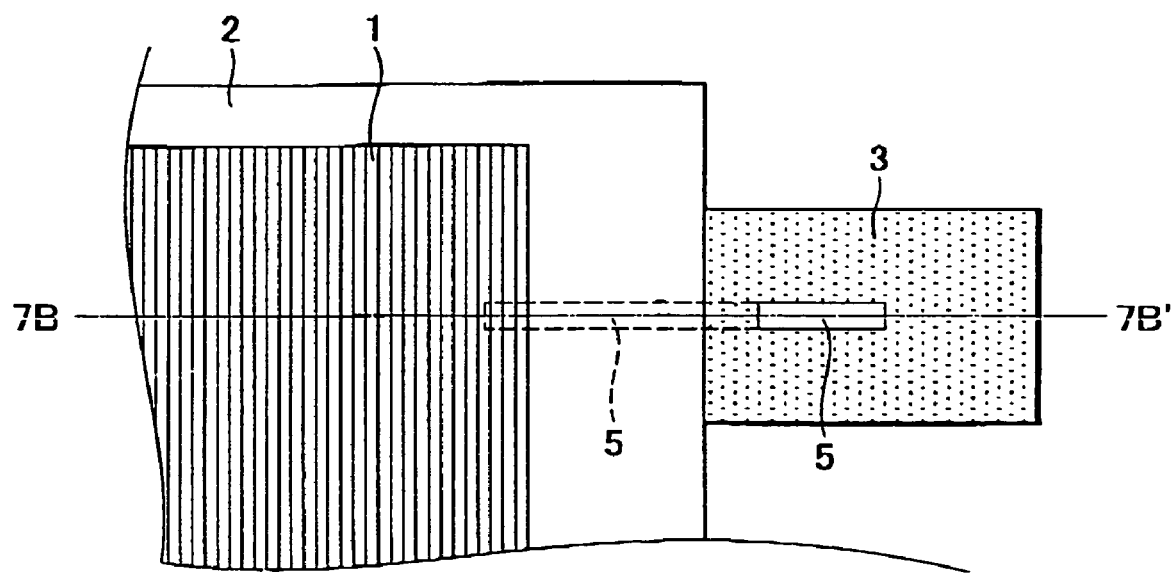
FIG. 7A is a schematic plan view showing a solar cell module of Example 1 which has been processed in a sealing step.
Figure 7B:
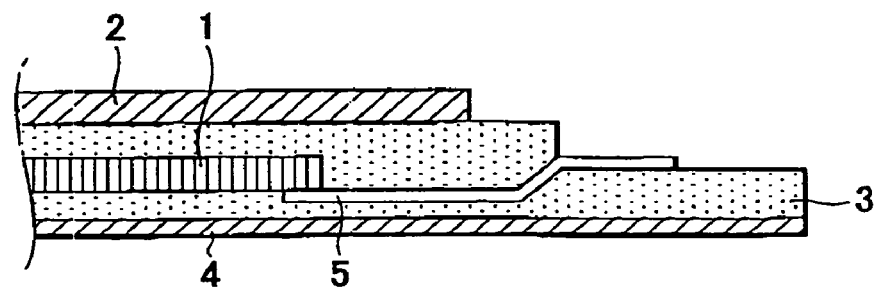
FIG. 7B is a schematic sectional view of the solar cell module taken along the line 7B-7B'.

Steps prior to a step of preparing solar cell elements 1 are the same as those of Example 1. Steps subsequent to the preparing step are described below with reference to FIGS. 6A to 6C.

One of lead electrodes 5 each including corresponding tin-plated copper sheets is soldered to a bus bar electrode 17 and the other one is soldered to a conductive substrate. The bus bar electrode 17 functions as a first electrode for the solar cell elements 1 and is placed at a light-incident side of the solar cell module, and the conductive substrate functions as a second electrode for the solar cell elements 1.

The following components are stacked on a polyester film having a thickness of 200 µm in this order: a first sheet having a thickness of 0.4 mm, the solar cell elements 1, a second sheet having a thickness of 0.4 mm, and a transparent fluorocarbon resin film having a thickness of 50 µm. The first and second sheets contain an EVA resin for sealing the solar cell elements 1. The resulting components are heated and then pressed with a vacuum laminator, thereby sealing the solar cell elements 1. In the above configuration, the polyester film and the first sheet disposed thereon each have corresponding protrusions extending out past an outer edge of the fluorocarbon resin film. A moisture-proof layer 20 including an aluminum sheet 19 laminated with a polyester film 18 is placed on the protrusion of the first sheet. Ends of the lead electrodes 5 are placed on the moisture-proof layer 20.

The lead electrodes 5 are each soldered to corresponding input leads 16 connected to an electronic circuit board 15 included in a DC transformer. A housing 6 is joined to the protrusion of the first sheet with a moisture-curable silicone adhesive 9. Electrical wiring members 7 routed into the housing 6 are each soldered to corresponding terminal blocks placed on the electronic circuit board 15. An addition reaction-type two-part silicone potting compound 13 is placed in the housing 6 such that the housing 6 is filled with the addition reaction-type two-part silicone potting compound 13. A lid member 14 including an aluminum plate is placed on the top of the resulting housing 6, thereby sealing the housing 6.

In order to evaluate the reliability of the electrode-routing section and the transformer-joining section, the solar cell module prepared according to the above procedure was subjected to a temperature/humidity cycle test in the same manner as that of Example 1 while a predetermined voltage was applied to the transformer. After the test was finished, the hermeticity of the transformer-joining section was evaluated.

The evaluation result showed that the electronic circuit board 15 of the transformer was electrically insulated and the transformer-joining section of the module of this example had satisfactory hermeticity. Moisture was prevented from penetrating the electronic circuit board 15 by the aluminum sheet 19 disposed below the transformer and lid member 14, whereby wires and electronic components disposed on the electronic circuit board 15 were prevented from being corroded and failures were therefore prevented from occurring in the transformer. Furthermore, pseudo-sunlight having a brightness of 1 sun was applied to the transformer-joining section at an atmospheric temperature of 40° C. using a solar simulator. The transformer was prevented from being overheated because of the heatsink effect of the aluminum sheet 19 and lid member 14. Therefore, the transformer was operated without trouble.

As described above, a solar cell module of the present invention includes an electric device placed at a light-incident side of the solar cell module and also Includes an electrode-routing section and an electric device-fixing section, which can be formed at low cost even if a front member is made of resin or glass. Such sections can be used not only for housings but also for devices, such as transformers, including electronic substrate boards, whereby such devices can be operated outdoors over a long period with no trouble.

In the above examples, the solar cell elements made of amorphous silicon are used. However, other solar cell elements made of crystalline silicon, polycrystalline silicon, or microcrystalline silicon may be used.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solar cell module comprising:
   a front member provided at a light-incident side of the solar cell module;
   a sealing member having an exposed section that is not covered with the front member, wherein the exposed section extends out past an outer edge of the front member;
   solar cell elements that are sealed with the sealing member and covered with the front member;
   an electric device, stored in a housing, for extracting electricity generated by the solar cell elements;
   a lead electrode through which the electricity generated by the solar cell elements is extracted, the lead electrode being electrically connected to the solar cell elements and the electric device; and
   a rear member located at a non-light-incident side of the solar cell module, wherein the rear member extends out past an outer edge of the front member, and wherein a portion of the sealing member is disposed between the rear member and the solar cell elements,
   wherein the lead electrode is placed on the exposed section,
   wherein a portion of the sealing member is disposed between the lead electrode and the rear member, and
   wherein the housing is fixed on the exposed section and is located at the light-incident side of the solar cell module.

2. The solar cell module according to claim 1, wherein the housing is directly fixed on the exposed section.

3. The solar cell module according to claim 2, wherein the exposed section has an adhesive function.

4. The solar cell module according to clam 1, wherein the housing is fixed on the exposed section with an adhesive, with the adhesive being sandwiched between the housing and the exposed section.

5. The solar cell module according to claim 1, wherein the exposed section is used for extracting electricity from the solar cell elements.

6. The solar cell module according to claim 1, wherein the lead electrode comprises a metal sheet.

7. The solar cell module according to claim 1, further comprising a moisture-proof layer disposed between the electric device and the sealing member.

8. The solar cell module according to claim 7, wherein the moisture-proof layer comprises a metal strip.

9. The solar cell module according to claim 1, further comprising an electrical wiring member that is connected to the electric device and fixed on the exposed section.

10. The solar cell module according to claim 1, wherein the housing is filled with a resin.

11. The solar cell module according to claim 1, wherein the electric device is a terminal box.

12. The solar cell module according to claim 1, wherein the electric device is a converter for converting electricity generated by the solar cell elements.

13. A method of manufacturing the solar cell module according to claim 1, comprising the steps of:
  connecting the solar cell elements in series;
  stacking a rear member, a first sheet, the solar cell elements, a second sheet, and the front member in that order to form a layered structure; and
  heating and pressing the layered structure, whereby the solar cell elements are sealed,
  wherein the first sheet and the rear member each have a portion which extends out past an outer edge of the front member, and
  wherein the sealing member is formed from the first and second sheets.

14. The method according to claim 13, wherein the housing is placed on the portion of the first sheet which extends out past an outer edge of the front member before the heating and pressing step; and wherein the housing is directly fixed to the exposed section during the heating and pressing step.

* * * * *